Oct. 7, 1958 R. D. LOHMAN 2,855,468

TRANSISTOR STABILIZATION CIRCUITS

Original Filed Nov. 15, 1952

INVENTOR.
Robert D. Lohman
BY
H. L. Newton
ATTORNEY.

2,855,468

TRANSISTOR STABILIZATION CIRCUITS

Robert D. Lohman, Princeton, N. J., assignor to Radio Corporation of America, a corporation of Delaware Continuation of application Serial No. 320,656, November 15, 1952. This application January 14, 1957, Serial No. 634,085

6 Claims. (Cl. 179—171)

This application is a continuation of co-pending application Serial No. 320,656, filed on November 15, 1952, now abandoned.

This invention relates generally to signal amplifier circuits and particularly to semi-conductor signal amplifier circuits having two signal paths arranged for push-pull operation.

Two classes of semi-conductor devices have been utilized in signal amplifier circuits to which the present invention pertains. One class is the junction transistor which comprises a semi-conductive body having two end zones of one type of semi-conductive material separated by and contiguous with an intermediate zone of an opposite type of semi-conductive material. Electrodes are placed in essentially low-resistance contact with the respective zones to provide a means for external circuit connections. The electrodes which are in contact with the respective end zones are termed the emitter electrode and the collector electrode. The electrode which is in contact with the intermediate or center zone is termed the base electrode. The junction transistor can then, of course, be of the N–P–N type or the P–N–P type. These two types of junction transistors will be hereinafter referred to as being opposite conductivity types.

The second class of semi-conductor devices is known as the point contact transistor which comprises a semi-conductive body having two electrodes in high-resistance or rectifying contact therewith and a third electrode in low resistance contact therewith. The semi-conductive body may be a germanium or silicon crystal of the N or P type. The two electrodes which are in high-resistance contact with the semi-conductive body are termed the emitter electrode and the collector electrode. The electrode which is in low resistance contact with the semi-conductive body is termed the base electrode.

As mentioned above in connection with junction transistors, point contact transistors of the N and P type will be referred to hereinafter as opposite conductivity types. It is, however, noted that an N type point contact transistor is of the same conductivity type as a P–N–P junction transistor.

Transistors have been applied to signal amplifier circuits having two signal paths to provide push-pull operation. It has been found, however, that these circuits may require adjustment upon substitution of transistors due to the fact that each of the signal paths should have identical characteristics statically and dynamically in order to provide stability in operation and substantially distortionless signal output. It has been found, however, that even though transistors are manufactured with an attempt to provide a uniformity of characteristics, the ultimate characteristic of the units may vary within wide limits. This variation of transistor characteristics may cause a circuit which has been properly adjusted for one set of transistors to operate unsatisfactorily with a substituted set of transistors. It has also been found that due to the fact that there are parallel signal paths there is a required symmetry of operation between the two signal paths.

Consequently a difference of transistor characteristics between the transistor or transistors utilized in one of the signal paths from the characteristics of the transistor or transistors utilized in the other signal path may result in unstable operation and distortion.

Accordingly, it is an object of the present invention to provide an improved and highly stabilized semi-conductor amplifier circuit of the push-pull type.

It is another object of the present invention to provide an improved direct current stabilized push-pull semi-conductor amplifier circuit which enables the utilization of semi-conductor devices therein having non-uniform characteristics.

It is still another object of the present invention to provide an improved semi-conductor amplifier circuit which enables stable push-pull operation with semi-conductor devices having a wide variety of operating characteristics.

It is a further object of the present invention to provide an improved semi-conductor amplifier circuit which provides stable, efficient, class B operation while permitting the utilization of semi-conductor devices having a wide variety of characteristics.

The novel features that are considered characteristic of this invention are set forth with particularity in the appended claims. This invention itself, however, both as to its organization and method of operation, as well as additiondal objects and advantages thereof, will be best understood from the following description when read in connection with the accompanying drawing, in which;

Figure 1:
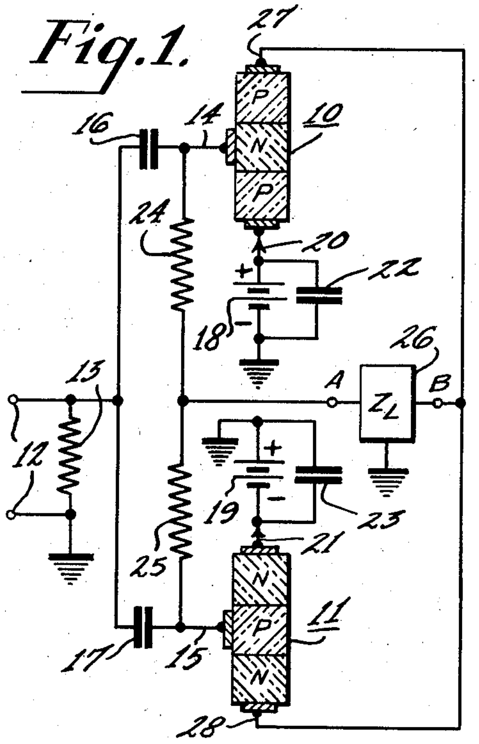
Figure 1 is a schematic circuit diagram of a semi-conductor amplifier circuit embodying the present invention.

Referring now to the drawing and particularly to Figure 1, two junction transistors 10 and 11 are connected in a parallel path signal amplifier circuit. An input circuit comprising a pair of input terminals 12 and an input resistor 13 is coupled to each of the base electrodes 14 and 15 by means of a pair of coupling capacitors 16 and 17.

Energizing potentials for the transistors 10 and 11 are supplied by sources of direct current energizing potentials which are illustrated as batteries 18 and 19 connected respectively between the emitter electrodes 20 and 21 and a point of fixed reference potential such as ground. These batteries 18 and 19 may be by-passed at signal frequencies by the respective capacitors 22 and 23.

Biasing potentials for the base electrodes 14 and 15 are respectively provided by the biasing resistors 24 and 25. In order to provide a proper bias between the base electrodes and their respective emitter electrodes, the resistance value of the biasing resistors 24 and 25 must be carefully selected as will be more fully described hereinafter. And output circuit which includes at least a portion of the impedance 26 illustrated as a rectangle containing the legend $Z_L$ is connected in common between the collector electrodes 27 and 28 and ground.

Let it be assumed for the moment that the junction of the bias resistors 24 and 25 is connected directly to ground instead of to the terminal A of the impedance 26. With such a connection the impedance 26 would then represent the output load impedance of the amplifier circuit and would not incorporate the present invention. In order to enable a more complete understanding of the present invention, the circuit as modified will be discussed.

It will be further assumed that the circuit has been adjusted for proper operation so that the collector electrode current of the transistor 10 is equal to the collector electrode current of the transistor 11 and, therefor, no current will flow through the output impedance 26. In other words, each of the transistors 10 and 11 is the direct current load impedance for the other transistor. This further means that the terminal B of the impedance 26 is at ground potential.

If an input signal is then applied to the input terminals 12, this signal will be simultaneously applied between the respective base and emitter electrodes of each of the two transistors. In view of the fact that the transistor 10 is a P–N–P junction transistor and the transistor 11 is an N–P–N junction transistor or in other words they are opposite conductivity types, the input signal will have an opposite symmetrical effect on the collector electrode currents of the two transistors 10 and 11. If the input signal is such as to cause the base electrode 14 to be driven in a negative direction this will cause the collector electrode current of the transistor 10 to increase. At the same time, the base electrode 15 of the transistor 11 will also be driven in a negative direction. This will cause the collector electrode current of the transistor 11 to decrease as contrasted with the increase in the collector electrode current of the transistor 10. There is, therefore, a differential current which is the difference between the respective collector currents. This differential current must flow through the output load impedance 26. It thus can be seen that the effect in the output circuit of the amplifier is that of push-pull amplification.

Now let it be assumed that the junction of the bias resistors 24 and 25 is connected to the terminal A of the impedance 26 as is shown in Figure 1. Let it be further assumed that the static characteristics of transistor 10 are different from the static characteristics of the transistor 11. The collector electrode current of the transistor 10 will then be of a different value from the collector electrode current of the transistor 11 with a given set of conditions. There will be, therefore, in a static condition, a differential current which will flow through the impedance 26 thereby developing a voltage across the impedance 26. The polarity of the voltage which is developed across the impedance 26 due to the static differential current will be determined by the transistor which has the highest current carrying capabilities.

It will now be seen that depending upon the particular network utilized as the impedance 26, all or a portion of the voltage which is so developed across the impedance 26 may be applied to the base electrodes 14 and 15 of the transistors 10 and 11 to vary the respective biases in such a direction as to reduce this differential current. In other words, the operating points of the respective transistors will be shifted so as to compensate for any difference there might be in their respective static characteristics.

For the purpose of further discussion, let it be assumed that the transistor 10 has a larger collector electrode current than the transistor 11. With these conditions, current will flow from the battery 18 through the semi-conductive body of the transistor 10 out of the collector electrode 27 through collector electrode 28 through the semi-conductive body of the transistor 11 and the two batteries 18 and 19. There will, however, be a portion of the current which flows out of the collector electrode 27 which will not flow into the collector electrode 28. This differential current will flow through the impedance 26 to ground. There will, therefore, be developed across the impedance 26 a positive potential with respect to ground. This positive potential or a portion thereof appears at the terminal A of the impedance 26 which is connected to the junction of the two bias resistors 24 and 25. Accordingly the base electrodes 14 and 15 of the transistors 10 and 11 will each be driven in a positive direction with respect to ground.

The base electrode 14 of the transistor 10, therefore, becomes more positive with respect to the emitter electrode 20 which is in such a direction so as to reduce the current carrying capabilities of the transistor 10. The base electrode 15 is driven more positive with respect to the emitter electrode 21, which is in such a direction as to increase the current carrying capabilities of the transistor 11. It is, therefore, seen that the differential current which existed will be reduced as this differential current existed because the collector electrode current of the transistor 10 was greater than the collector electrode current of the transistor 11.

It should be noted at this time that the bias resistors 24 and 25 will have to be selected to have a value which will provide a voltage drop, when traversed by the respective base electrode currents, of such a magnitude to be substantially equal to the voltage provided by the batteries 18 and 19. This requirement is brought about by the fact that when the circuit is in proper adjustment the terminal A of the impedance 26 is effectually at ground potential. The respective emitter electrodes 20 and 21 are, for direct current purposes, maintained above ground by the voltage of the batteries 18 and 19. Therefore, if a proper bias is to be applied between the base electrodes 14 and 15 and their respective emitter electrodes 20 and 21, the voltage drop which is developed across the respective bias resistors 24 and 25 which is in such a direction as to oppose the voltage of the respective sources 18 and 19 must be substantially equal to the voltage of the respective sources 18 and 19.

Figure 2:
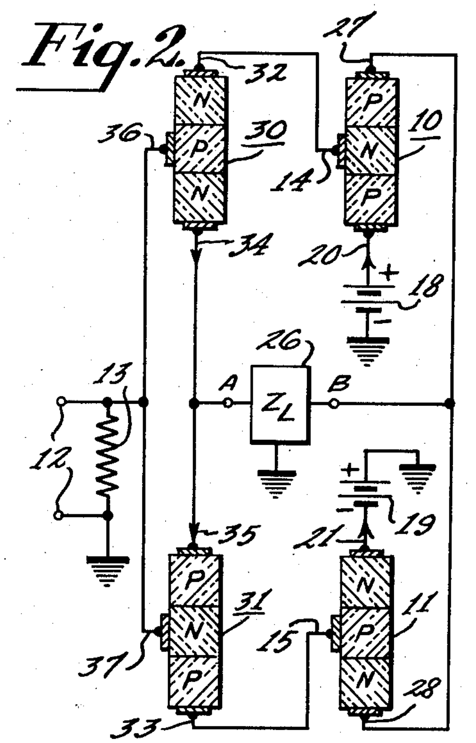
Figure 2 is a schematic circuit diagram of a semi-conductor amplifier circuit also embodying the invention which is a modification of that shown in Figure 1.

Referring now to Figure 2, the output transistors 10 and 11 of the push-pull circuit are arranged in a circuit substantially identical to that above discussed in connection with Figure 1. However, the input circuit which was above shown as a resistor-capacitor coupling network comprises a pair of driving transistors 30 and 31, the collector electrodes 32 and 33 of which are directly connected respectively to the base electrodes 14 and 15 of the output transistors 10 and 11. The emitter electrodes 34 and 35 are connected in common to the A terminal of the impedance 26. An input circuit comprising a pair of input terminals 12 and an input resistor 13 is connected in common to the base electrodes 36 and 37 of the driving transistors 30 and 31.

The overall operation of the circuit illustrated in Figure 2 is susbtantially identical to the operation of the two transistors shown in Figure 1. Since each of the parallel paths utilizes a pair of transistors directly connected in cascade, only one of the signal paths will be discussed. This discussion is of course applicable to either or both of the signal paths.

In view of the fact that the collector electrode 32 is directly connected to the base electrode 14, the currents which flow out of the base electrode 14 must flow into the collector electrode 22. In other words, the only return path to ground for the base electrode 14 is through the driving transistor 30 and the current of the base electrode 14 is the same and, therefore, must be equal to the current of the collector electrode 32.

It is noted that the driving transistors 30 and 31 are of opposite conductivity types as are the output transistors 10 and 11, and further that in each of the signal paths the driving transistor is of the opposite conductivity type from its associated output transistor. It thus can be seen, for example, that the driving transistor 30 is of the N–P–N junction type such as the RCA TA154 and the output transistor 10 is of the P–N–P junction type such as the RCA TA153.

Accordingly, it may be seen that if a positive pulse is applied to the base electrode 36, the current carrying capability of the transistor 30 will be increased. This, of course, means that the current of the base electrode 14 must in a like manner be increased which produces a corresponding increase in the current carrying capability of the output transistor 10. There is, therefore, produced in the output circuit of the transistor 10 a collector electrode current which is an amplified version of the input signal.

If each of these two transistors 30 and 10 is capable of producing a current gain in the order of 20, it is readily seen that a change, for example, of 50 microamperes in the current of the base electrode 36 will produce a change in the current of the collector electrode 32 of 1,000 microamperes or 1 milliampere, which change will further produce a corresponding change of 20,000 microamperes or 20 milliamperes in the current of the collector electrode 27. It is thus seen that high current and power gains may be obtained from a circuit of this type without the use of coupling capacitors or other frequency limiting circuit elements.

It is, of course, to be understood that the operation of the other signal path comprising the driving transistor 31 and the output transistor 11 is symmetrical to and the same as that discussed above.

Accordingly, let it be assumed that a sine wave is applied to the input terminals 12 with the positive going portion of the wave first being applied to the base electrodes 36 and 37. Upon the application of the positive portion of the wave, assuming that the circuit has been adjusted for class B operation, an output current will be produced by current flow out of the collector electrode 27 and through the impedance 26. As the input wave changes from the positive to the negative portion, the current conduction of the path comprising the driving transistor 30 and the output transistor 10 will be reduced to zero and an output current will be produced by current flow into the collector electrode 28 and through the impedance 26.

Figure 3:
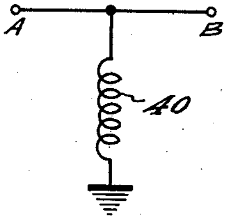
Figures 3 through 8 are schematic circuit diagrams showing circuit elements adapted for use in the amplifier circuits illustrated in Figures 1 and 2 in accordance with the invention.

Reference will now be made to Figure 3 wherein there is illustrated one type of circuit which may be utilized as the impedance 26 shown in Figures 1 and 2. The inductor 40, which is connected between the terminals A and B and ground, may be the voice coil of a loudspeaker or the deflection yoke of a kinescope deflection system and is shown merely for the purpose of illustration and is not to be considered as restrictive of the scope of the invention.

With this type of arrangement, it is readily seen that the feedback voltage is equal to the output voltage of the entire system and accordingly the voltage gain of the system will be less than unity. However, power and/or current is required for this type of output circuit and a current gain in the order of 400 is readily obtainable.

Figure 4:
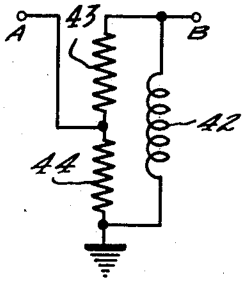

If it is desired that the feedback voltage which appears between the terminal A of the impedance 26 and ground be proportional to the output voltage rather than equal to the output voltage, a circuit such as illustrated in Figure 4 can be utilized. In this arrangement an output impedance, which is illustrated for purposes of convenience as an inductor 42, is connected between the terminal B and ground. A pair of resistors 43 and 44 are connected in shunt across the inductor 42 and provided with a tap at their junction to which terminal A is connected.

In view of the fact that the resistors 43 and 44 constitute a voltage divider arrangement, it is readily seen that the output voltage which appears between terminal A and ground is proportional to the output voltage which appears between terminal B and ground.

Figure 5:
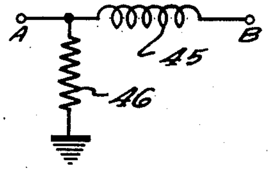

If on the other hand, it is desired to provide a feedback voltage which is proportional to the output current, an arrangement such as illustrated in Figure 5 can be utilized. An inductor 45 is connected in series with a resistor 46 between terminal B and ground. The feedback voltage is derived from the junction of the inductor 45 and the resistor 46. Since the feedback voltage is developed across the resistor 46 due to the output current flowing therethrough, the feedback voltage is proportional to the output current.

Figure 6:
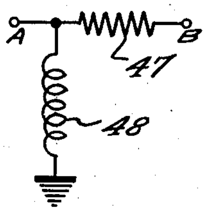

If it is desired to provide a feedback voltage which is proportional to the derivative output current, an arrangement such as illustrated in Figure 6 can be utilized. In this instance, a resistor 47 is connected in series with an inductor 48 between terminal B and ground. The signal feedback voltage is derived from the junction of the resistor 47 and the inductor 48. In view of the fact that the voltage which is developed across the inductor 48 will be proportional to the derivative of current flowing through the inductor 48, there will, therefore, be provided a feedback voltage which will be proportional to the derivative of output current.

Figure 7:
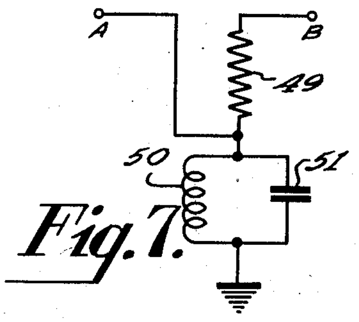

The circuit illustrated in Figure 7 may also be utilized as the impedance 26. In this circuit the load impedance is represented by a resistor 49 connected in series with a parallel tuned circuit comprising an inductor 50 and a parallel capacitor 51. It is readily seen that the parallel tuned circuit, which is frequency selective, will provide a feedback voltage only at the selected frequency. Accordingly, and in view of the fact that the resistance of the parallel tuned circuit will be low, no direct current stabilization will be provided, but on the other hand, the voltage gain of the circuit will be reduced at the selected frequency. In other words, with this type of feedback arrangement the amplifier will reject the frequency to which the parallel resonant tuned circuit is tuned and will amplify all other frequencies.

Figure 8:
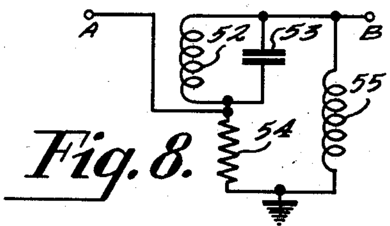

An arrangement which will reject all frequencies except the selected frequency is illustrated in Figure 8 wherein a parallel tuned circuit comprising an inductor 52 and a capacitor 53 is connected in series with a feedback resistor 54 in shunt with an inductor 55. With this arrangement, it is readily seen that a feedback voltage will appear across the feedback resistor 54 at all frequencies except the frequency to which the parallel resonant tuned circuit is tuned.

The above examples of impedance networks which may be utilized for the impedance 26 shown in Figures 1 and 2 of the drawing have been given for purposes of illustration only. It is readily apparent that there may be other configurations which may be utilized in place of those illustrated without departing from the spirit of the invention.

The exact form which the impedance 26 will take will depend primarily upon the function which is to be produced with the amplifier circuit. Any of the inductors 40, 42, 48 and 55 may, for example, be the voice coil of a loudspeaker or the deflection yoke of a kinescope, and may have resistive components. It is possible to provide extremely stable class B operation and substantially distortionless output while utilizing the inductor 40 illustrated in Figure 3 as the impedance 26 in the amplifier circuit illustrated in Figure 2.

For example, a 16 ohm voice coil of a standard loudspeaker has been utilized in such a circuit arrangement to provide entirely satisfactory output with a circuit utilizing two N–P–N junction transistors of the RCA type TA154 and two P–N–P junction transistors of the RCA type TA153. Each of the two batteries 18 and 19 was a six volt dry cell battery and the input resistor 13 was in the order of 10,000 ohms.

There is one additional requirement for the impedance 26 which has not before been mentioned and which will now be discussed. It is required that the impedance network, which is utilized as the impedance 26, provide a direct current path from the terminal A to ground. This is necessary due to the fact that the emitter electrodes 34 and 35 are connected in common to the terminal A of the impedance 26, and these electrodes represent the return path to ground for the respective base electrodes 14 and 15. It can be seen by reference to Figures 3 through 8 that each of these circuit configurations provides a direct current path from terminal A to ground. Accordingly this requirement is met by each of the illustrations.

It is thus readily seen that such a circuit, which is capable of providing stable operation with transistors having a wide variety of operating characteristics is the acme of simplicity, as the only required components are a simple input circuit, the output impedance, the transistor and a source of operation potential. There are no frequency limiting elements in the overall system.

What is claimed is:

1. A push-pull signal amplifier circuit comprising in combination, a first transistor of one conductivity type including a first input, a first output, and a first common electrode, a second transistor of an opposite conductivity type including a second input, a second output, and a second common electrode, input circuit means for simultaneously applying an input signal of the same instantaneous phase and magnitude to said first and second input electrodes, a third transistor of said opposite conductivity type including a third input, a third output, and a third common electrode, direct-current conductive means connecting said first output electrode with said third input electrode, a fourth transistor of said one conductivity type including a fourth input, a fourth output, and a fourth common electrode, direct-current conductive means connecting said second output electrode with said fourth input electrode, load impedance means direct-current conductively connected with said third and fourth output electrodes for developing a voltage which is dependent on a difference in the static operating characteristics of said transistors, and means direct-current conductively connecting said load impedance means with said first and second common electrodes for applying said voltage thereto to compensate for the differences in the static operating characteristics of said transistors.

2. A push-pull signal amplifier circuit comprising in combination, a first transistor of one conductivity type including a first emitter, a first base, and a first collector electrode, a second transistor of an opposite conductivity type including a second emitter, a second base, and a second collector electrode, input circuit means connected in said circuit for simultaneously applying an input signal of the same instantaneous phase and magnitude to said first and second base electrodes, a third transistor of said opposite conductivity type including a third emitter, a third base, and a third collector electrode, direct-current conductive means connecting said first collector electrode with said third base electrode, a fourth transistor of said one conductivity type including a fourth emitter, a fourth base, and a fourth collector electrode, direct-current conductive means connecting said second collector electrode with said fourth base electrode, load impedance means direct-current conductively connected with said third and fourth collector electrodes for developing a voltage which is dependent on a difference in the static operating characteristics of said transistors, and means direct-current conductively connecting said load impedance means with said first and second emitter electrodes for applying said voltage thereto to compensate for the differences in the static operating characteristics of said transistors.

3. In a push-pull signal amplifier circuit the combination comprising at least a pair of transistors of opposite conductivity types including base, emitter, and collector electrodes, said pair of transistors being connected in said amplifier circuit to provide two parallel signal amplification paths, input circuit means connected for simultaneously applying an input signal of the same instantaneous phase and magnitude to the base electrodes for each of said paths, means including a point of reference potential providing a direct-current supply source connected in said amplifier circuit for applying biasing potentials to said transistors, signal output load impedance means direct-current conductively connected between each of said collector electrodes and said point of reference potential providing the signal output load for the collector electrodes of both of said paths for developing across said load impedance means a push-pull output signal and a direct voltage representative of the difference in the static operating characteristics of said transistors, and direct-current conductive means connected with said load impedance means and in said amplifier circuit for applying said direct voltage between the base and emitter electrodes for each of said paths, said direct voltage providing decreased forward bias for the base and emitter electrodes of one of said paths and increased forward bias for the base and emitter electrodes of the other of said paths in response to increases of direct collector current flow of said one of said paths.

4. In a push-pull signal amplifier circuit the combination comprising a pair of transistors of opposite conductivity types including base, emitter, and collector electrodes, said pair of transistors being connected in said amplifier circuit to provide two parallel signal amplification paths, input circuit means connected for simultaneously applying an input signal of the same instantaneous phase and magnitude to the base electrodes of each of said transistors, means including a point of reference potential providing a direct-current supply source connected in said amplifier circuit for applying biasing potentials to each of said transistors, signal output load impedance means direct-current conductively connected between each of the collector electrodes of said transistors and said point of reference potential providing the signal output load for said transistors for developing across said load impedance means a push-pull output signal and a direct voltage representative of the difference in the static operating characteristics of said transistors, and direct-current conductive means connecting said load impedance means with the base electrode of each of said transistors for applying said direct voltage between the base and emitter electrodes of each of said transistors, said direct voltage providing decreased forward bias for the base and emitter electrodes of one of said transistors and increased forward bias for the base and emitter electrodes of the other of said transistors in response to increases of direct collector current flow of said one of said transistors.

5. In a push-pull signal amplifier circuit the combination comprising a pair of transistors of opposite conductivity types including base, emitter, and collector electrodes, said pair of transistors being connected in said amplifier circuit to provide two parallel signal amplification paths, input circuit means connected for simultaneously applying an input signal of the same instantaneous phase and magnitude to the base electrodes of each of said transistors, means including a point of reference potential providing a direct-current supply source, said supply source having a pair of terminals, means connecting the emitter electrode of one of said transistors with one of said terminals, means connecting the emitter electrode of the other of said transistors with the other of said terminals, signal output load impedance means direct-current conductively connected between the collector electrodes of each of said transistors and said point of reference potential providing the signal output load for the collector electrodes of both of said paths for developing across said load impedance means a push-pull output signal and a direct voltage representative of the difference in the static operating characteristics of said transistors, and direct-current conductive means connecting said load impedance means with the base electrodes of each of said transistors for applying said direct voltage between the base and emitter electrodes of each of said transistors, said direct voltage providing decreased forward bias for the base and emitter electrodes of one of said transistors and increased forward bias for the base and emitter electrodes of the other of said transistors in response to increases of direct collector current flow of said one of said transistors.

6. A signal amplifying circuit comprising, in combination, a first transistor of one conductivity type including base, emitter, and collector electrodes, a second transistor of an opposite conductivity type including base, emitter, and collector electrodes, input circuit means connected for applying an input signal to the base electrode of said first transistor, first direct-current conductive means directly-connecting the collector electrode of said first transistor with the base electrode of said second transistor, means providing a direct-current supply source having a pair of terminals and connected in said amplifier circuit for applying biasing potentials to each of said transistors, means connecting the emitter electrode of said second transistor with one terminal of said source, second direct-current conductive means connecting the collector electrode of said second transistor with the emitter electrode of said first transistor, voltage dropping impedance means connected at one end to said second direct-current conductive means and at the other end to the other terminal of said source and providing degenerative feedback from the collector of said second transistor to the emitter of said first transistor, and signal output means connected for deriving an output signal between the collector and emitter electrodes of said second transistor.

No references cited.